United States Patent [19]

Wakamiya et al.

[11] Patent Number: 5,101,251
[45] Date of Patent: Mar. 31, 1992

[54] SEMICONDUCTOR MEMORY DEVICE WITH IMPROVED STACKED CAPACITOR STRUCTURE

[75] Inventors: Wataru Wakamiya; Ikuo Ogoh, both of Hyogo, Japan

[73] Assignee: Mitsubishi Denki Kabushiki Kaisha, Tokyo, Japan

[21] Appl. No.: 376,660

[22] Filed: Jul. 7, 1989

[30] Foreign Application Priority Data

Jul. 8, 1988 [JP] Japan ................................ 63-171523

[51] Int. Cl.⁵ .................... H01L 29/68; H01L 27/02; H01L 29/06; H01L 29/04
[52] U.S. Cl. .................................... 357/23.6; 357/41; 357/51; 357/55; 357/59
[58] Field of Search ...................... 357/236, 23.4, 23.6, 357/55

[56] References Cited

U.S. PATENT DOCUMENTS

| | | | |
|---|---|---|---|
| 4,151,607 | 4/1979 | Koyanagi et al. | 365/174 |
| 4,641,166 | 2/1987 | Takemae et al. | 357/23.6 |
| 4,794,563 | 12/1988 | Maeda | 357/23.6 |
| 4,894,696 | 1/1990 | Takeda et al. | 357/55 |
| 4,907,046 | 3/1990 | Ohji et al. | 357/23.6 |

FOREIGN PATENT DOCUMENTS

| | | | |
|---|---|---|---|
| 3910033 | 3/1989 | Fed. Rep. of Germany | |
| 61-55258 | 3/1977 | Japan | 357/23.6 |
| 602784 | 12/1982 | Japan | 357/23.6 |
| 62-36853 | 9/1985 | Japan | 357/23.6 |

OTHER PUBLICATIONS

Takashi Akahori, "Planarization of Insulating Interlayer by Bias ECR Plasma CVD" Semi Technology Symposium (Nov. 28, 1988), pp. 127-137.
M. Kumanoya et al., "A 90ns 1Mb DRAM with Multi--Bit Test Mode," *IEEE International Solid-States Circuits Conference* (1985), pp. 240-241.

*Primary Examiner*—Andrew J. James
*Assistant Examiner*—Cynthia S. Deal
*Attorney, Agent, or Firm*—Lowe, Price, Leblanc & becker

[57] ABSTRACT

A DRAM having stacked capacitor cell comprises one transfer gate transistor and one capacitor. A thick insulating film having flat surface is formed on the surface of the transfer gate transistor and the like. A conductive film is formed on a surface of one impurity region of the transfer gate transistor. An opening portion deep enough to reach the conductive film is formed in the insulating film. The capacitor is formed in the opening portion and on the upper surface of the insulating film. A lower electrode of the capacitor is connected to the conductive film. An insulating film having a flat surface is formed by a reflow process employing thermal processing, plasma ECR CVD method and the like.

11 Claims, 6 Drawing Sheets

SEMICONDUCTOR MEMORY DEVICE WITH IMPROVED STACKED CAPACITOR STRUCTURE

BACKGROUND OF THE INVENTION

1. Field of the Invention

The present invention relates generally to semiconductor memory devices and, more specifically, to a stacked capacitor type semiconductor memory device capable of inputting/outputting arbitrary memory data at random and to the method for making the same.

2. Description of the Background Art

Recently, semiconductor memory devices are in great demand as information machines such as computers have come to be widely used. Semiconductor memory devices having large memory capacitances and capable of high speed operation are desired. Accordingly, the technology in association with the higher degree of integration, the high speed responsiveness and higher reliability of the semiconductor memory devices has been developed.

Figure 5:
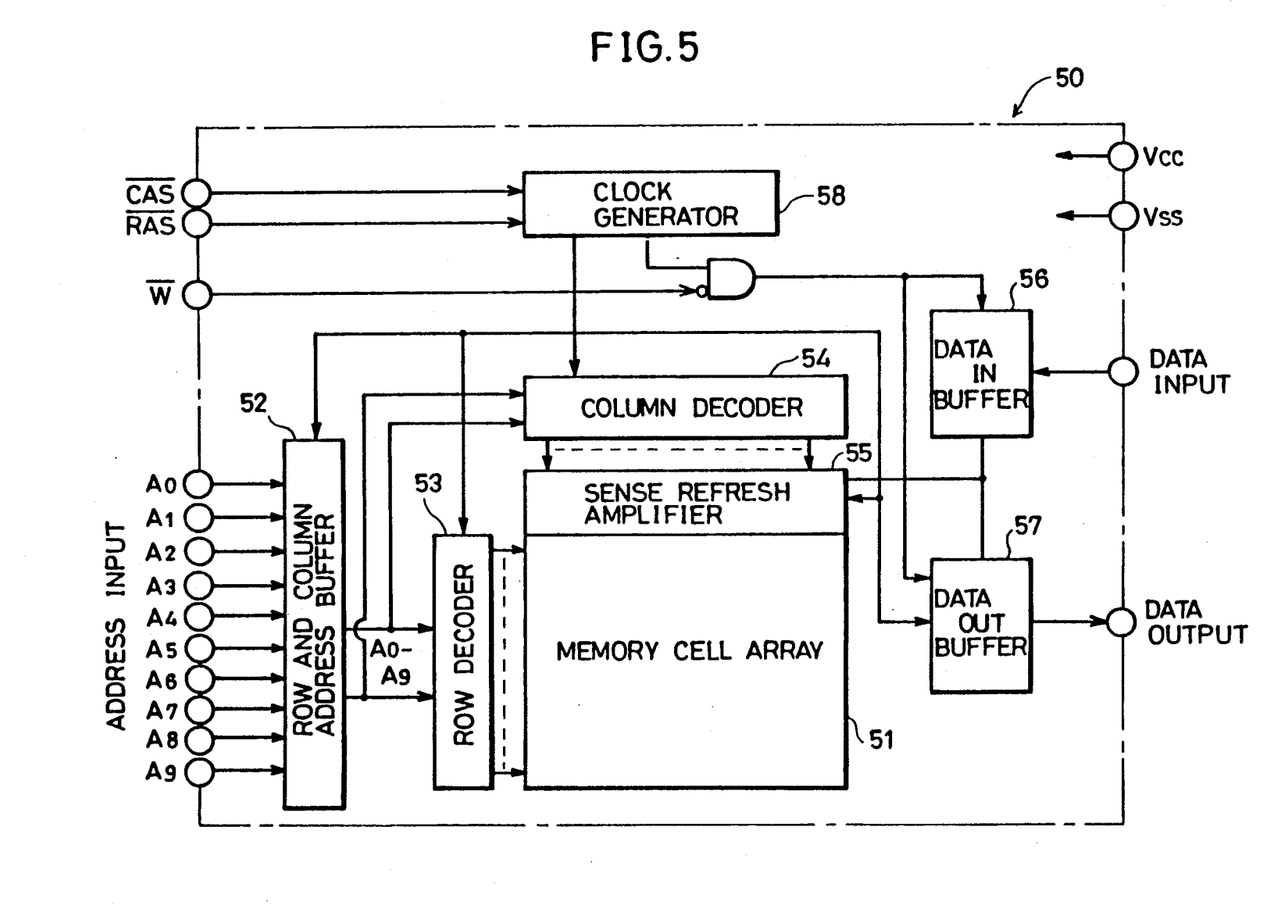
FIG. 5 is a block diagram showing a structure of a conventional DRAM.

A DRAM (Dynamic Random Access Memory) is a semiconductor memory device capable of inputting/outputting memory data at random. Generally, a DRAM comprises a memory cell array which is a memory region storing a large number of memory data and peripheral circuits required for external input/output. FIG. 5 is a block diagram showing a structure of a common DRAM. Referring to the figure, the DRAM 50 comprises a memory cell array 51 for storing data signals representing memory information, a row and column address buffer 52 for externally receiving an address signal for selecting a memory cell constituting a unit memory circuit, a row decoder 53 and a column decoder 54 for designating the memory cell by interpreting the address signal, a sense refresh amplifier 55 for amplifying the signals stored in the designated memory cell to read the same, a data in buffer 56 and a data output buffer 57 for data input/output, and a clock generator 58 for generating clock signals.

Figure 6:
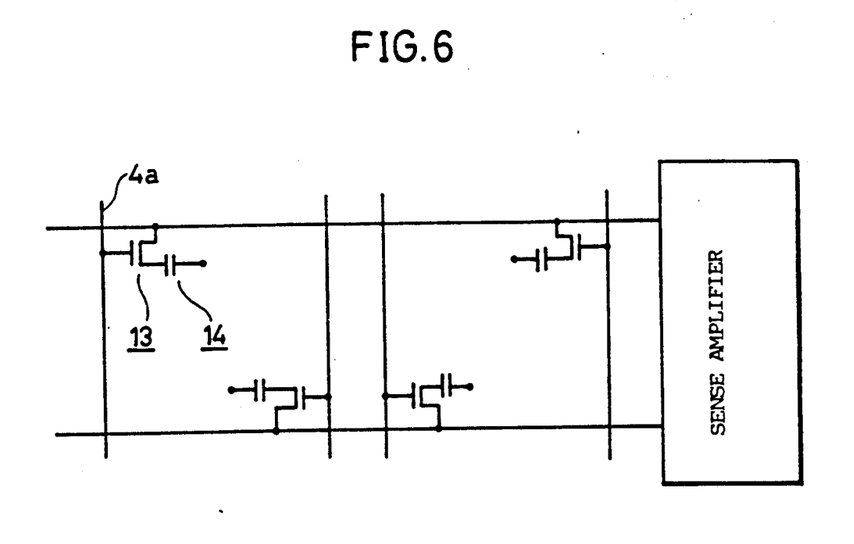
FIG. 6 is an equivalent circuit diagram showing a portion of the memory cell array of the DRAM shown in FIG. 5.

The memory cell array 51 occupying a large area on a semiconductor chip is formed of an arrangement of a plurality of memory cells each storing unit memory data. FIG. 6 is an equivalent circuit diagram of 4 bits of memory cells constituting the memory cell array 51. The shown memory cell is a 1-transistor 1-capacitor type memory cell comprising one MOS (Metal Oxide Semiconductor) transistor and one capacitor element connected thereto. The memory cell structure of this type is simple and it enables improvement of the degree of integration of the memory cell array, so that the structure is widely used for DRAMs having large capacitances.

Figure 7:
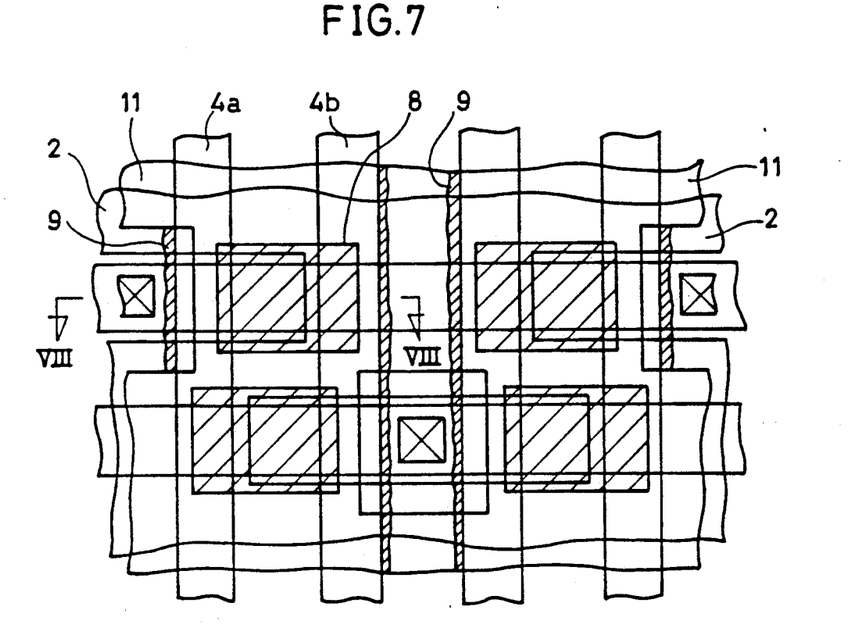
FIG. 7 is a plan view of the memory cell array shown in the equivalent circuit diagram of FIG. 6.

FIG. 7 is a plan view showing one example of a stacked capacitor type memory cell array of a DRAM. FIGS. 8A to 8D are cross sectional views taken along the line VIII—VIII of FIG. 7 showing, in order, the steps of manufacturing the structure. Such stacked type memory cells of the DRAMs are manufactured in accordance with the following manufacturing steps.

Figure 8A:
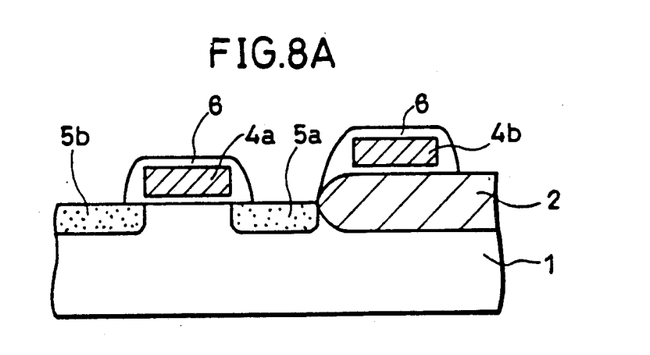
FIGS. 8A, 8B, 8C and 8D are cross sectional views showing step by step the method for manufacturing the memory cell of the conventional DRAM.

First, as shown in FIG. 8A, a thick field oxide film 2 is formed on a surface of a semiconductor substrate 1 to surround an element forming region by LOCOS (Local Oxidation of Silicon) method. Thereafter, patterned gate electrodes (word lines) 4a and 4b are formed on the surface of the semiconductor substrate 1 with a thin oxide film 3 interposed therebetween. Impurity diffused regions 5a and 5b are formed on the surfaces of the semiconductor substrate 1 on both sides of the gate electrode 4a formed on the surface of the semiconductor substrate 1. The periphery of the gate electrodes 4a and 4b are covered with an insulating film 6.

Figure 8B:
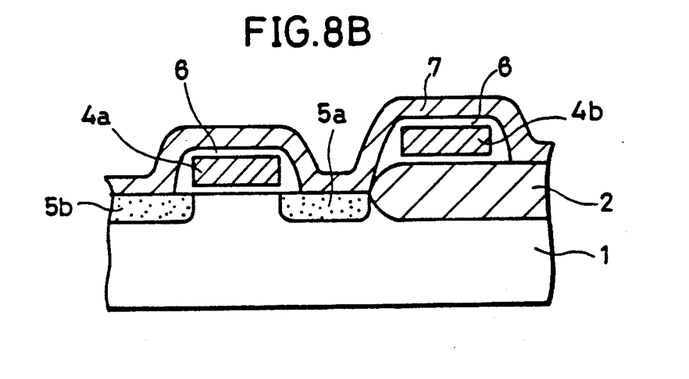

Next, as shown in FIG. 8B, a conductive polysilicon layer 7 is stacked on the surface of the insulating film 6.

Figure 8C:
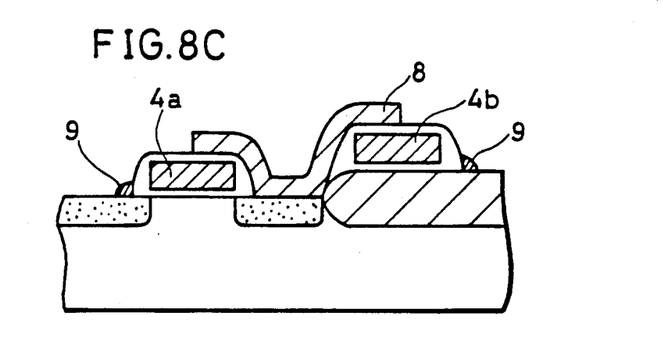

Further, as shown in FIG. 8C, the polysilicon layer 7 is patterned to a prescribed pattern by anisotropic etching such as reactive ion etching. An anisotropic etching takes place for example by directing ions onto the surface, of polysilicon layer 7. Reaction between the ions and the layer proceeds, and the layer is etched by a common thickness in the single direction into the layer. The patterned polysilicon layer 7 constitutes a lower electrode 8 of the capacitor. The surface area of the lower electrode 8 formed of polysilicon should be as large as possible to increase the capacitance of the capacitor. Therefore, the polysilicon layer 7 deposited in the step of FIG. 8B is made thick. The etching method employed for patterning is anisotropic etching in which etching is not effected in the horizontal direction to the main surface of the substrate. However, due to the anisotropic etching, wherein a common thickness of polysilicon layer 7 is etched throughout, portions of the polysilicon layer 7 are left as residues 9 in the regions where the surface of the semiconductor substrate 1 or the surface of the field oxide film 2 intersects the side regions of the gate electrode 4. The regions where the residues 9 are formed are shown in the plan view of FIG. 7.

Figure 8D:
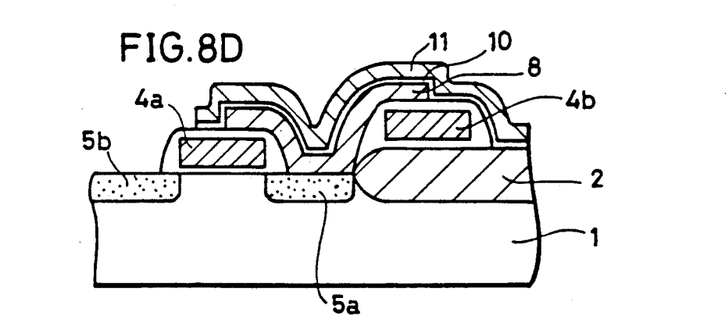

Thereafter, as shown in FIG. 8D, a silicon nitride film 10 constituting a dielectric layer of the capacitor is deposited, a polysilicon layer constituting an upper electrode 11 is stacked and the capacitor is formed by patterning.

In the above described conventional method for manufacturing stacked type DRAMs, the residue 9 of the conductive polysilicon formed in the step of manufacturing the lower electrode 8 shown in FIG. 8C is a problem. Namely, as shown in FIG. 7, the residues 9 are formed to cause short circuit between electrodes of the capacitors of the memory cells formed spaced apart from each other in the horizontal direction. Therefore, in operation, short circuits are caused by the conductive residues 9 between the memory cells, resulting in malfunctions and the like.

Figure 9A:
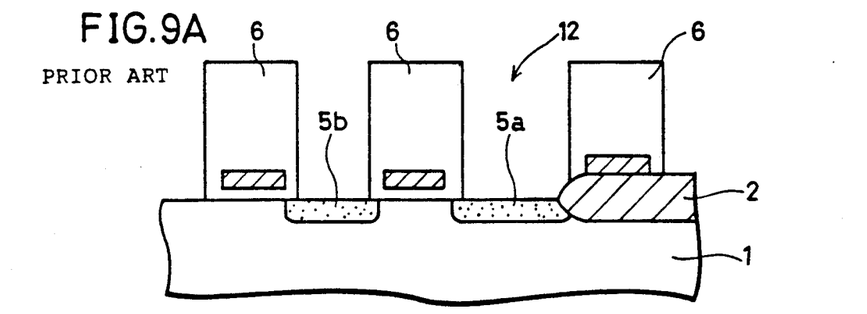
FIGS. 9A and 9B are cross sectional views of main steps of the process for manufacturing a memory cell of another conventional DRAM.
Figure 9B:
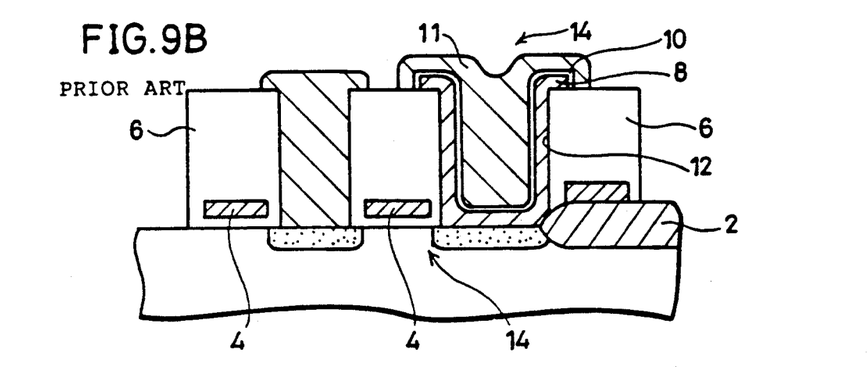

A prior art solution of the problem derived from the residues of etching will be described in the following. A structure is shown in Japanese patent Laying-Open No. 6853/1987 in which the capacitance of the capacitor is further increased compared with the above described stacked type DRAM. FIGS. 9A and 9B are cross sectional views showing the cross sectional structure of the memory cell of a DRAM shown in this gazette in accordance with a representative manufacturing process. In this example, an insulating film 6 covering a gate electrode 4 of a transfer gate transistor 13 is made thick, and a capacitor 14 is formed utilizing an opening portion 12 and the surface thereof selectively formed in the insulating film 6. Important manufacturing steps will be described in the following.

First, as shown in FIG. 9A, an insulating film 6 is deposited thick on a semiconductor substrate 1 on which a transfer gate transistor 13 is formed. The surface of the film is made flat. Thereafter, the insulating film 6 is patterned, and opening portions 12 are formed on the surfaces of impurity diffuse regions 5a and 5b formed on the surface of the semiconductors substrate 1.

Thereafter, as shown in FIG. 9B, a capacitor 14 is formed in the opening portion 12 of the insulating film 6 and on the surface of the insulating film 6. The capacitor 14 comprises a lower electrode 8 which is in direct contact with the impurity diffused region 5a, an upper electrode 11, and a dielectric layer 10 sandwiched by the lower electrode 8 and the upper electrode 11. The lower electrode 8 terminates on a flat surface of the insulating film 6. Therefore, in the step of patterning the lower electrode 8, there will be no residue since no portion of the electrode 8 is left in etching. Namely, the opening portion 12 is formed only on the surfaces of the impurity diffused regions 5a and 5b. The opening portion 12 is not formed between the impurity regions adjacent to each other with the field insulating film 2 interposed therebetween. Therefore, there is no residue of etching formed over the adjacent impurity regions. In addition, the capacitor 14 curves from the surface of the insulating film 6 along the inner wall of the opening portion 12. Consequently, the surface area of the capacitive coupling becomes large, increasing the capacitance.

However, the method for manufacturing the memory cell having such structure comprises a step of patterning for forming the opening portion 12 in the insulating film 6 as shown in FIG. 9A. In this step, the photolithography method is used in general. This method comprises a step of aligning pattern mask for forming the opening portion 12. Since there should be a margin in consideration of the error in aligning masks, the width of the diffusion of the impurity diffuse region 5a naturally becomes wide. The width of diffusion of the impurity diffused region 5a is a factor preventing minimization of the memory cell structure.

As described above, in the memory cell structure of the DRAM, the following points are desired, namely, the gate structure of the transfer gate transistor constituting the memory cell should be minimized, and the junction area of the capacitor should be increased to maintain and further to increase the capacitance of the capacitor which naturally decreases as the transistor structure is minimized. However, the conventional method comprises disadvantages such as short circuits between capacitors derived from the manufacturing process and the enlargement of the impurity diffused region of the transistor derived from the increase of the capacitance of the capacitor.

SUMMARY OF THE INVENTION

An object of the present invention is to improve the degree of integration by miniaturizing the structure of semiconductor memory devices.

Another object of the present invention is to increase the capacitor capacitance of a DRAM having a stacked capacitor and to miniaturize the structure of a memory cell.

A further object of the present invention is to provide a method for manufacturing a DRAM which minimizes the residue defects during manufacturing.

A still further object of the present invention is to provide a method for manufacturing a DRAM having a reduced number of lithographic steps.

The semiconductor memory device of the present invention is a semiconductor memory device including a memory region formed by arranging a plurality of unit memory circuits each having a switching element with two impurity regions formed on a semiconductor substrate and a first conductive layer formed on the semiconductor substrate sandwiched by these impurity regions, and a signal storing passive element with a first electrode layer connected to one impurity region of the switching element, a second electrode layer and a dielectric film sandwiched between the first electrode layer and the second electrode layer, wherein an insulating film having a flat surface and a selectively opened concave portion is formed on the surface of the semiconductor substrate where the switching element is formed. The signal storing passive element is formed extending to the surface of the insulating film and to the inside of the concave portion, with at least a portion of the first electrode layer of the signal storing passive element connected to one impurity region through a conductive film formed on the impurity region of the switching element.

A junction area of the signal storing passive element is increased so as to increase the capacitance by the above described structure. In addition, since both end portions terminate on a flat surface of the insulating film, perfect patterning can be carried out in which there will be no residue of the material constituting the first element in the step of etching for forming the terminal portion.

The concave portion formed in the insulating film is connected to one of the impurity diffused regions of the switching element through a conductive layer. The conductive layer is wider than the impurity diffuse region. The electrical junction between the signal storing passive element formed in the concave portion of the insulating film and the switching element is realized through the conductive layer. Consequently, the impurity region of the switching element can be formed with minimum width of diffusion which enables contact of the impurity region with the conductive layer. In addition, the signal storing passive element in the opening portion should be formed such that it is fully in contact with the conductive layer in the width region of the conductive layer, which is wider than the impurity region. Therefore, the width of diffusion in the impurity region can be reduced, since there is no need to provide margin for the error in alignment of masks for forming the opening portion. In addition, the width of the opening in the insulating film can be freely selected within the width of the conductive layer. Consequently, the junction area of the signal storing passive element formed in the opening portion of the insulating film can be further enlarged to increase the capacitance thereof.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

One embodiment of the present invention will be hereinafter described with reference to the figures.

Figure 1:
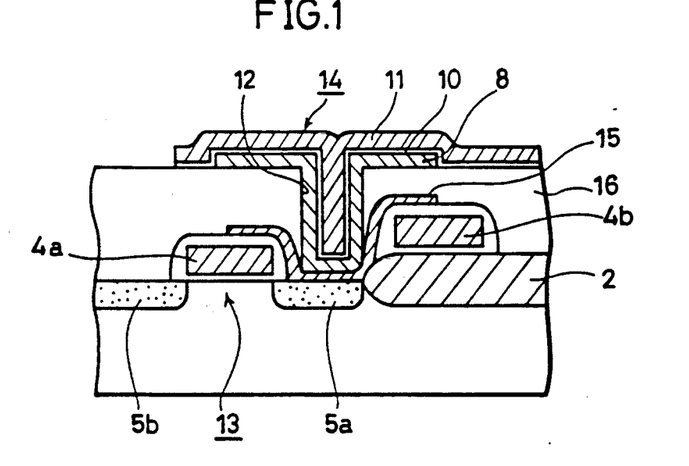
FIG. 1 is a cross sectional view of a memory cell of a DRAM in accordance with a first embodiment of the present invention.

FIG. 1 is a cross sectional view of a memory cell of a DRAM in accordance with one embodiment of the present invention. As is shown in the figure, the memory cell comprises one transfer gate transistor (switching element) 13 and one capacitor (signal storing passive element) 14. The memory cell is surrounded by a thick field oxide film 2 formed on a surface of a semiconductor substrate 1 to be insulated and isolated from adjacent memory cells. The transfer gate transistor 13 comprises impurity diffused regions 5a and 5b formed on the surface of the semiconductor substrate 1 and a gate electrode 4a formed between the impurity diffused regions 5a and 5b with a thin gate oxide film 3 interposed therebetween. The capacitor 14 comprises a lower electrode 8 and an upper electrode 11 formed of conductive materials such as polysilicon, and a dielectric layer 10 formed of a dielectric materials such as a nitride film or an oxide film sandwiched by the electrodes. The capacitor 14 is formed such that it extends over an insulating film 16 formed thick on the surface of the semiconductor substrate 1 with the surface made flat and extends curved along an opening portion 12 formed in the insulating film 16. The lower electrode 8 of the capacitor 14 is connected to one impurity region 5a of the transfer gate transistor 13 through a conductive film 15 formed of polysilicon or the like. The conductive film 15 is formed extending over the gate electrode 4a of the transfer gate transistor 13 and over the gate electrode 4b formed on a surface of the field oxide film 2.

In such memory cell structure, the width of diffusion of one impurity diffused region 5a of the transfer gate transistor 13 is defined only by the limitation in the contact area between the impurity diffused region and the conductive film 15. Consequently, there is no need to provide margin in consideration of errors in the alignment of masks in the photolithography step for forming the opening portion 12 in the insulating film 16 in the succeeding steps. As a result, the width of diffusion of the impurity diffuse region 5a can be reduced. In addition, the opening portion 12 of the insulating film 16 is formed to be connected with the conductive film 15 in the range where the conductive film 15 is formed. Therefore, there are sufficient margin for the positioning of the opening portion 12 of the insulating film 16 with regard to the conductive film 15 which is formed widely extending over the gate electrode 4a and the like of the transfer gate transistor 13. In addition, the width of the opening portion 12 in the insulating film 16 need not be defined by the width of diffusion of the impurity region 5a. Therefore, the width of the opening portion 12 can be enlarged, whereby the junction area of the capacitor 14 formed in the opening portion 12 can be enlarged to increase the capacitance.

In the following, the method for manufacturing the memory cell of this embodiment will be described with reference to FIGS. 2A to 2D.

Figure 2A:
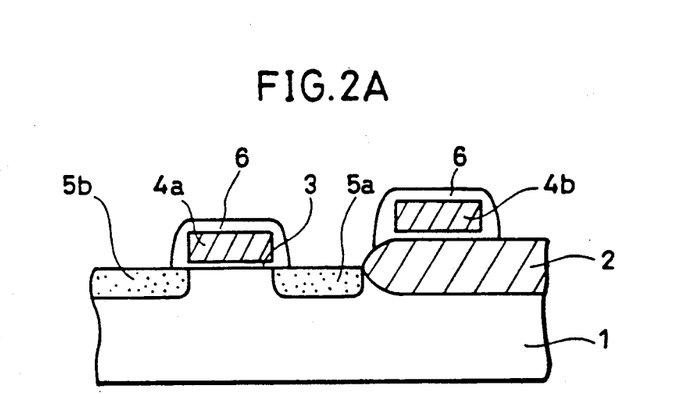
FIGS. 2A, 2B, 2C and 2D are cross sectional views showing step by step the process for manufacturing the memory cell of the first embodiment.

First, as shown in FIG. 2A, a thick field oxide film 2 is formed on a surface of the semiconductor substrate 1 by the LOCOS method. The surface of the semiconductor substrate 1 is thermally oxidized to form a thin oxide film 3. A polysilicon layer and an insulating film 6 are deposited by the CVD method or the like. Prescribed patterns are formed by photolithography and etching. Consequently, gate electrodes 4a and 4b of a transfer gate transistor 13 are formed. Ions of impurities are implanted to the surface of the semiconductor substrate 1 using the gate electrode 4a as a mask. By doing so, the impurity regions 5a and 5b are formed. Thereafter, an insulating film 6 is deposited further on the surface of the semiconductor substrate 1, and the insulating film 6 is selectively removed by anisotropic etching to form sidewalls of the insulating film 6 on the sides of the gate electrodes 4a and 4b.

Figure 2B:
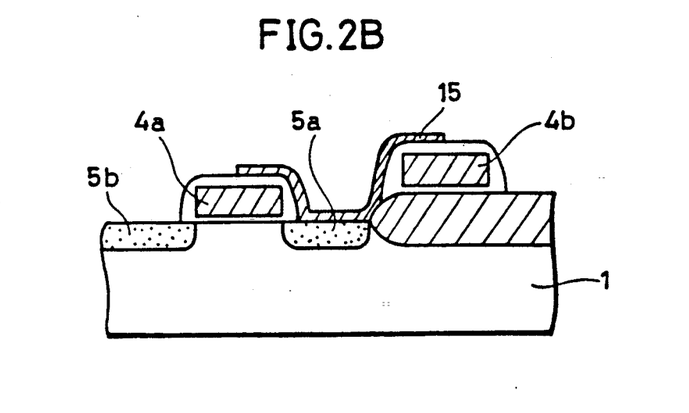

Thereafter, as shown in FIG. 2B, a conductive film 15 of polysilicon or the like is deposited thin on the surface of the semiconductor substrate 1. The polysilicon layer is patterned such that it is positioned on a region extending from an upper portion of the gate electrode 4a of the transfer gate transistor 13 to an upper portion of the gate electrode 4b formed on the field oxide film 2. The conductive film 15 has a portion deposited on an upper portion of the impurity diffuse region 5a, which portion serves as a contact region.

Figure 2C:
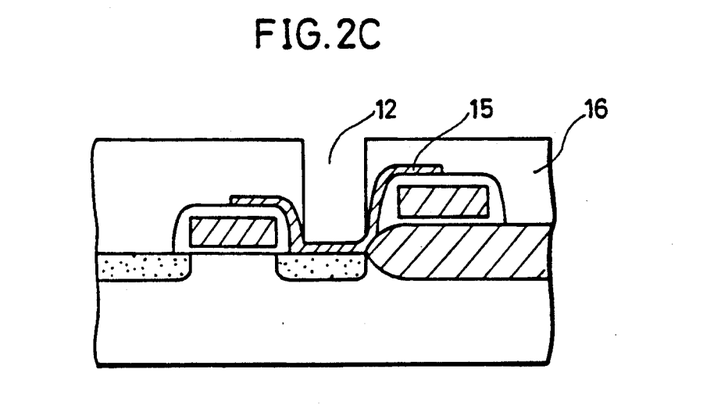

Next, as shown in FIG. 2C, a thick insulating film 16 such as a silicon oxide film is deposited on the surface of the conductive film 15 and the like by the CVD method. The silicon oxide film is deposited such that the surface of the thick insulating film 16 becomes flat. This step may be carried out by the following method. Namely, a BPSG (Boro-Phospho Silicate Glass) film is formed on the surface of the conductive film 15 and the like by the CVD method and thereafter, the BPSG film is reflown by thermal processing to make the surface thereof flat. As a further method, the insulating film 16 may be formed by RF bias ECR plasma CVD method. This method is disclosed in, for example, "Planarization of Insulating Interlayer by Bias ECR Plasma CVD" by T. Akahori et al, SEMI Technology Symposium, Nov. 28, 1988.

Thereafter, an opening portion 12 deep enough to reach the conductive film 15 is formed in the insulating film 16 by photolithography and etching. The area of the opening portion 12 is selected such that it is included in the region in which the conductive film 15 is formed. The mask used for forming the opening portion 12 is aligned with the region of the conductive film 15. Therefore, the error in aligning the mask is independent from the width of diffusion of the impurity diffused region 5a, and therefore it has no relation to the width of diffusion of the impurity diffused region 5a.

Figure 2D:
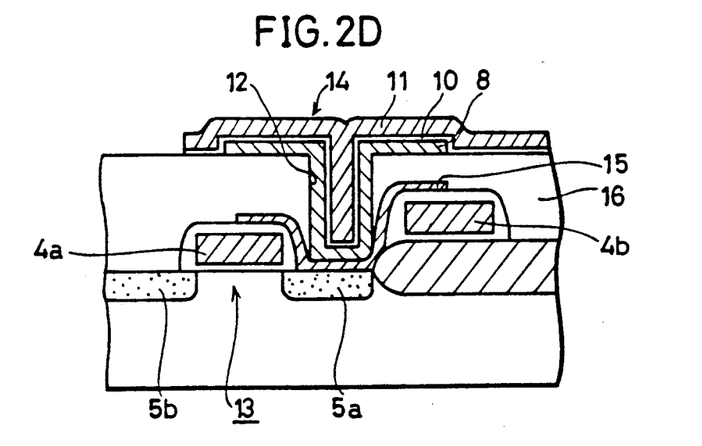

Thereafter, as shown in FIG. 2D, polysilicon is deposited on the surface of the insulating film 16 and on the inner surface of the opening portion 12 by the CVD method or the like. This polysilicon layer is patterned such that the terminal end portion of the polysilicon layer will be on the flat surface of the insulating film 16. The polysilicon layer constitutes the lower electrode 8 of the capacitor 14. The lower electrode 8 is connected to the conductive film 15 at the bottom of the opening portion 12 of the insulating film 16. This structure provides contact between the impurity diffused region 5a of the transfer gate transistor 13 and the lower electrode 8 of the capacitor 14 through the conductive film 15. A dielectric layer 10 formed of a silicon nitride film or a silicon oxide film is formed on the surface of the lower electrode 8 and so on, and a polysilicon layer is deposited thereon. These are patterned by etching to form the dielectric layer 10 and the upper electrode 11 of the capacitor 14. The transfer gate transistor 13 and the capacitor 14 constituting a memory cell of a DRAM are formed through the above described steps.

Figure 3:
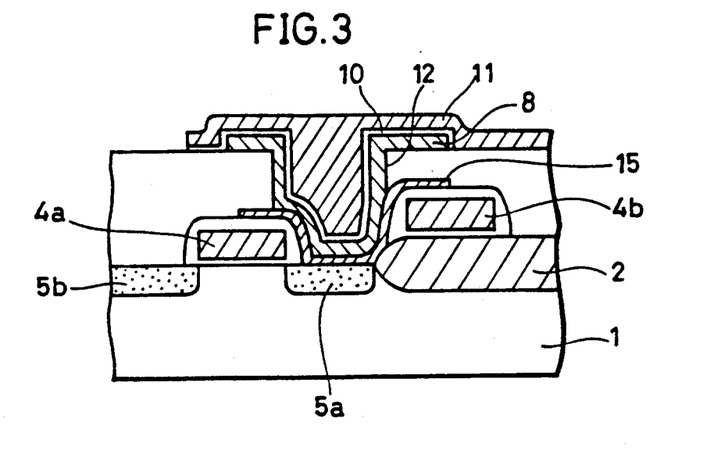
FIG. 3 is a cross sectional view of a memory cell of a DRAM in accordance with a second embodiment of the present invention.

FIG. 3 is a cross sectional view showing a structure of a memory cell in a DRAM in accordance with a second embodiment of the present invention. In this embodiment, the opening region of the opening portion 12 formed in the insulating film 16 is made wider than the diffusion region of the impurity diffused region 5a of the transfer gate transistor 13. By interposing a wide conductive film 15, the opening region of the opening portion 12 can be enlarged, whereby the capacitive junction region of the capacitor 14 can be extended wide in the vertical direction and in the horizontal of the opening portion 12 in the insulating film 16. This enables further increase of the capacitance of the capacitor 14.

Figure 4:
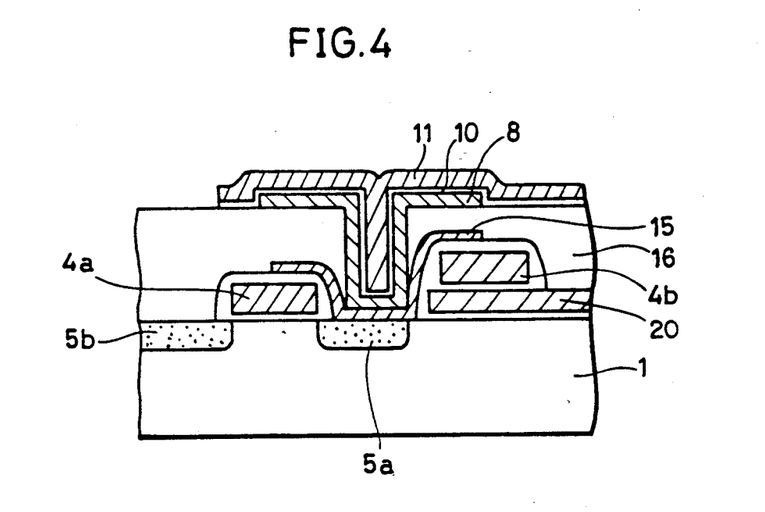
FIG. 4 is a cross sectional view of a memory cell of a DRAM in accordance with a third embodiment of the present invention.

FIG. 4 is a cross sectional view showing the structure of a memory cell of a DRAM in accordance with a third embodiment of the present invention. In this embodiment, the present invention is applied to a memory cell employing so called field shield isolating structure which utilizes the transistor structure to isolate elements from each other in the memory cell. In the field shield isolating structure, a transistor structure is formed between adjacent memory cells, a voltage enabling normally-off state of the transistor is applied to an electrode of the transistor structure so as to insulate and isolate memory cells from each other. Namely, an impurity region 5a of one transfer gate transistor 13 and another impurity region (not shown) of the other transistor constitute the source-drain regions with an isolating electrode 20 sandwiched therebetween constitutes a gate electrode. By applying a zero or negative potential to the isolating electrode 20, the formation of a channel on the surface of the semiconductor substrate below the isolating electrode 20 can be prevented. Further details of the field shield isolating structure are described in, for example, Japanese Patent Publication No. 55258/1986. Compared with the LOCOS isolating structure, the problem of the bird's beak enlarging the isolating region can be eliminated in this structure. The combination of this embodiment and the field shield isolating method capable of reducing the element isolating region further minimizes the memory cell structure.

Although the lower electrode 8 and the upper electrode 11 constituting the capacitor 14 are formed of polysilicon in the above described embodiment, they may be formed of metals such as aluminum, a metal having high melting point, and so on.

The shape of the capacitor 14 is not limited to those shown in FIGS. 1 and 4, and it maybe further curved on the surface of the insulating film 16, or it may have a step.

Although polysilicon is used as the conductive film 15 in the above described embodiments, it is not limited to this, and any conductive material may be employed.

As described above, in the present invention, the capacitance of the capacitor can be increased by forming the capacitor on the surface of and in a concave portion formed in an insulating film.

A conductive layer is interposed between the lower electrode of the capacitor and the impurity region of the transfer gate transistor so as to ease the limitation of the positional relation for connection between the electrode and the region. Therefore, the width of diffusion of the impurity region of the transfer gate transistor can be reduced since the margin for connection can be eliminated. Since the patterning of the capacitor is carried out on a flat surface of the insulating film, defects generated in patterning can be eliminated. Therefore, a semiconductor memory device having a high reliability in manufacturing can be provided in which the structure is minimized without reducing the capacitor capacitance.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device having a plurality of unit memory cells, each cell comprising:
   a switching device having two impurity regions formed space apart from each other in a major surface of a semiconductor substrate and a first conductive layer formed on said major surface of said semiconductor substrate between said two impurity regions;
   a signal storing passive element having a first electrode layer connected to one of said impurity regions of said switching element, a dielectric film formed in contact with said first electrode layer and a second electrode layer formed in contact with said dielectric film;
   an insulating film formed on said major surface of said semiconductor substrate, wherein the upper surface of said insulating film is substantially flat, said insulating film having an opening therethrough;
   wherein said signal storing passive element is formed on said substantially flat surface of said insulating film and in the opening in said insulating film; and
   a conductive film formed on said one impurity region of said switching element, wherein at least a portion of said first electrode layer of said signal storing passive element is connected to said conductive film.

2. A semiconductor memory device according to claim 1, wherein at least a portion of a bottom surface of said opening in the insulating film is positioned on a surface of one impurity region of said switching element to which said first electrode layer of said signal storing passive element is electrically connected.

3. A semiconductor memory device according to claim 1, wherein said conductive film is interposed between one impurity region of said switching element and the first electrode layer of said signal storing passive element, with an end portion thereof being extended to an upper portion of the first conductive layer of said switching element and to an upper portion of an element isolating region.

4. A semiconductor memory device according to claim 1, wherein
   said conductive film covers the surface of one impurity region of said switching element and has one end overlaid on an upper portion of said first conductive layer of said switching element with an insulating film interposed therebetween and the other end extending to be overlaid on an upper portion of a second conductive layer formed on an element isolating region with an insulating layer interposed therebetween, and said opening in said insulating film is formed to surround the surface region of said conductive film larger than said impurity region covered with said conducive film.

5. A semiconductor memory device according to claim 1, wherein said switching element and said signal storing passive element are formed on a surface of the semiconductor substrate surrounded by an element isolating region, and said element isolating region is sandwiched by adjacent impurity regions of said switching elements, and comprises an element isolating electrode layer formed on said semiconductor substrate with an isolating film interposed therebetween.

6. A semiconductor memory device according to claim 1, wherein said conductive film is formed of polycrystalline silicon.

7. A semiconductor memory device, comprising:
a semiconductor substrate having a major surface;
a plurality of word lines arranged in parallel in a row direction on the major surface of said semiconductor substrate;
a plurality of bit lines arranged in parallel in a column direction on the major surface of said semiconductor substrate; and
a plurality of memory cells arranged in the row and column directions to form a matrix, each said memory cell including
(a) a transfer gate transistor having a pair of impurity regions formed spaced apart from each other in said semiconductor substrate and a gate electrode formed on the major surface of said semiconductor substrate between the impurity regions with a gate insulating film interposed therebetween;
(b) an interlayer insulating film having an opening therethrough over one of the impurity regions of said transfer gate transistor, said interlayer insulating film covering the major surface of said semiconductor substrate on which said transfer gate transistor is formed, wherein the upper surface of the interlayer insulating film is substantially flat;
(c) a conductive film formed on the surface of one of said impurity regions of said transfer gate transistor; and
(d) a capacitor having a lower electrode formed on said substantially flat surface and in said opening of said interlayer insulating film with at least a portion thereof connected to said conductive film, and a dielectric layer and an upper electrode stacked in this order on the surface of the lower electrode.

8. A unit memory cell comprising:
a switching device having two impurity regions formed spaced apart from each other in a major surface of a semiconductor substrate and a first conductive layer formed on said major surface of said semiconductor substrate between said two impurity regions;
an isolation region surrounding said switching device, wherein said isolation region includes an isolating film formed on said major surface of said semiconductor substrate and an isolating electrode formed on said isolating film;
a conductive film formed on one of said impurity regions;
an insulating film formed on said unit memory cell, said insulating film having a flat upper surface and an opening; and
a signal storing element comprising a first electrode layer formed on a portion of said flat surface of said insulating film and in said opening of said insulating film, a dielectric film formed in contact with said first electrode layer and a second electrode layer formed in contact with said dielectric film; wherein a portion of said first electrode layer connects to said conductive film.

9. A unit memory cell according to claim 1, wherein the first electrode layer, the dielectric film and the second electrode layer extend into the opening through said insulating film.

10. A unit memory cell according to claim 7, wherein the dielectric layer and the upper electrode of said capacitor extend into the opening through said interlayer insulating film.

11. A unit memory cell according to claim 8, wherein the dielectric film and the second electrode layer extend into the opening through said insulating film.

* * * * *